United States Patent
Kato et al.

(10) Patent No.: US 7,957,174 B2
(45) Date of Patent: Jun. 7, 2011

(54) SEMICONDUCTOR MEMORY

(75) Inventors: Yoshiko Kato, Yokohama (JP);
Mitsuhiro Noguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/894,256

(22) Filed: Sep. 30, 2010

(65) Prior Publication Data

US 2011/0019469 A1  Jan. 27, 2011

Related U.S. Application Data

(63) Continuation of application No. 12/164,486, filed on Jun. 30, 2008, now Pat. No. 7,826,245.

(30) Foreign Application Priority Data

Jul. 2, 2007  (JP) ................................. 2007-174280

(51) Int. Cl.
*G11C 5/02* (2006.01)
(52) U.S. Cl. .............. 365/51; 365/63; 365/72; 257/208; 257/211
(58) Field of Classification Search .................... 365/51, 365/63, 72; 257/208, 211
See application file for complete search history.

(56) References Cited

U.S. PATENT DOCUMENTS

| | | | |
|---|---|---|---|
| 5,398,205 A | 3/1995 | Yamaguchi | |
| 5,627,390 A * | 5/1997 | Maeda et al. | 257/302 |
| 5,663,092 A * | 9/1997 | Lee | 438/253 |
| 6,150,688 A * | 11/2000 | Maeda et al. | 257/302 |
| 6,184,588 B1 * | 2/2001 | Kim et al. | 257/379 |
| 6,235,583 B1 * | 5/2001 | Kawata et al. | 438/257 |
| 6,348,374 B1 * | 2/2002 | Athavale et al. | 438/243 |
| 6,432,820 B1 * | 8/2002 | Lee et al. | 438/677 |
| 6,867,092 B2 * | 3/2005 | Uchiyama et al. | 438/244 |
| 6,870,213 B2 | 3/2005 | Cai et al. | |
| 6,870,231 B2 * | 3/2005 | Kim et al. | 257/379 |
| 7,094,652 B2 * | 8/2006 | Watanabe et al. | 438/286 |
| 7,352,018 B2 | 4/2008 | Specht et al. | |
| 7,352,618 B2 * | 4/2008 | Kim et al. | 365/185.02 |
| 7,521,351 B2 * | 4/2009 | Mikolajick et al. | 438/622 |
| 7,721,239 B2 | 5/2010 | Kato et al. | |
| 7,826,245 B2 * | 11/2010 | Kato et al. | 365/51 |
| 2002/0132424 A1 | 9/2002 | Furuhata | |
| 2007/0170589 A1 | 7/2007 | Kato et al. | |
| 2008/0073672 A1 | 3/2008 | Kato et al. | |

FOREIGN PATENT DOCUMENTS

| | | |
|---|---|---|
| JP | 5-88375 | 4/1993 |
| JP | 8-55920 | 2/1996 |
| JP | 2002-184875 | 6/2002 |
| JP | 2006-108510 | 4/2006 |

* cited by examiner

*Primary Examiner* — Viet Q Nguyen
(74) *Attorney, Agent, or Firm* — Oblon, Spivak, McClelland, Maier & Neustadt, L.L.P.

(57) ABSTRACT

A semiconductor memory includes a memory cell array area having a memory cell, a word line contact area adjacent to the memory cell array area, a word line arranged straddling the memory cell array area and the word line contact area, a contact hole provided on the word line in the word line contact area, and a word line driver connected to the word line via the contact hole. A size of the contact hole is larger than a width of the word line, and the lowest parts of the contact hole exist on a position lower than a top surface of the word line and higher than a bottom surface of the word line.

7 Claims, 16 Drawing Sheets

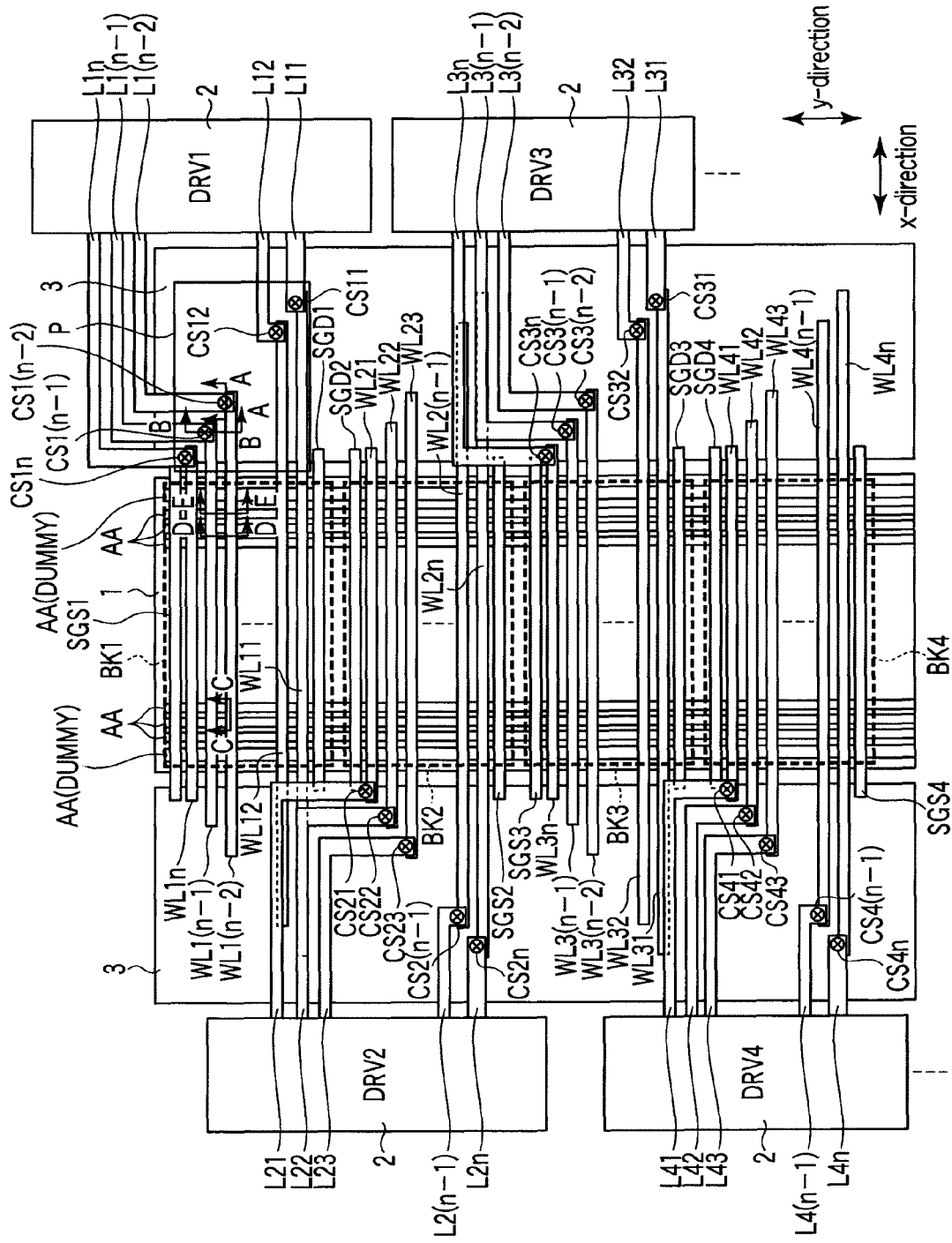
F I G. 2

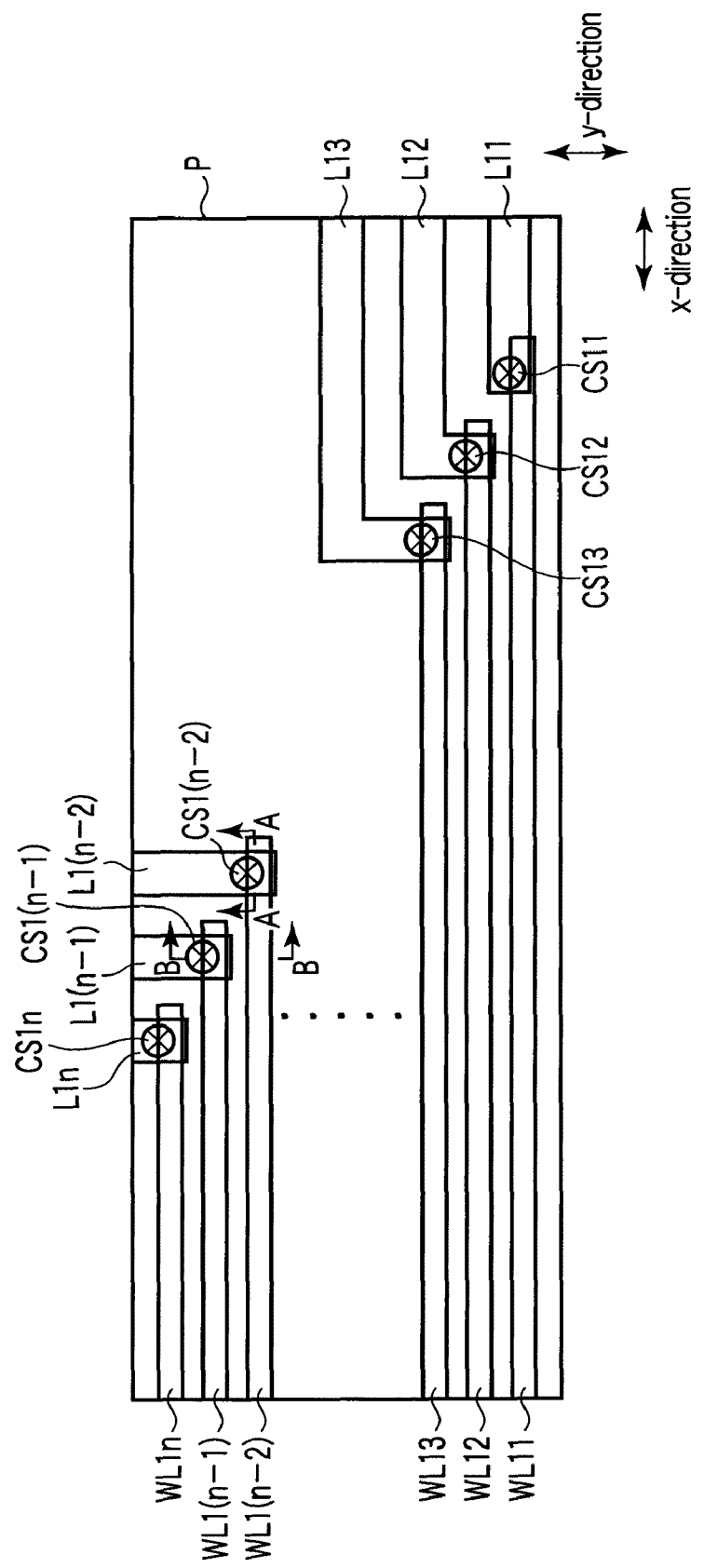
F I G. 3

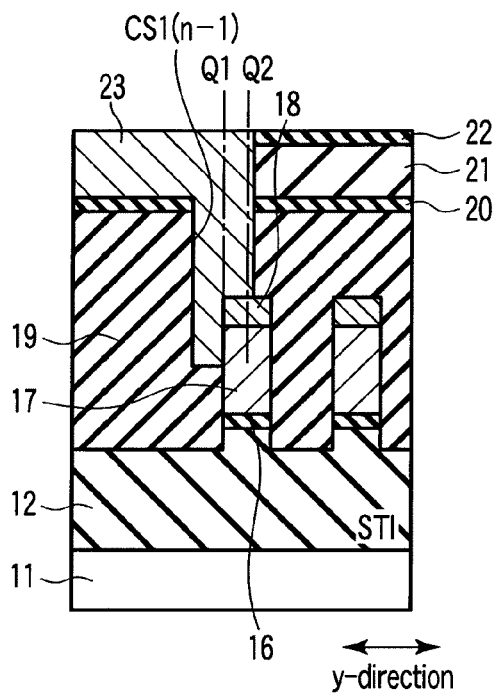
F I G. 5
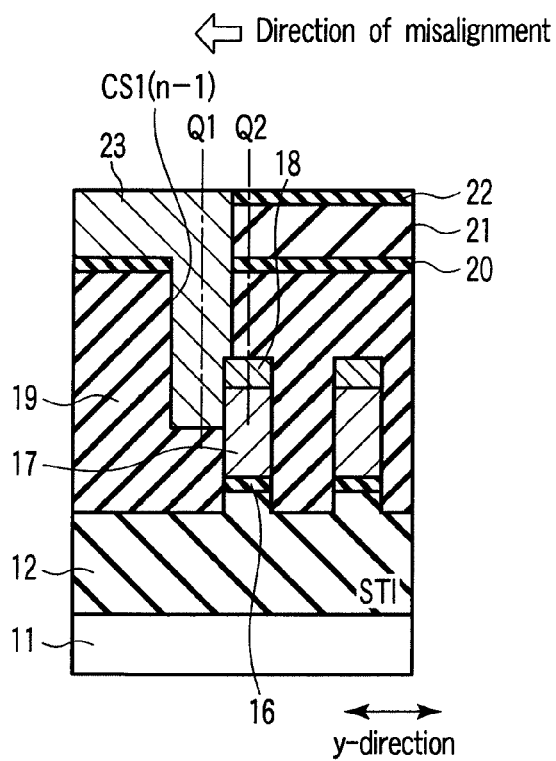
F I G. 6

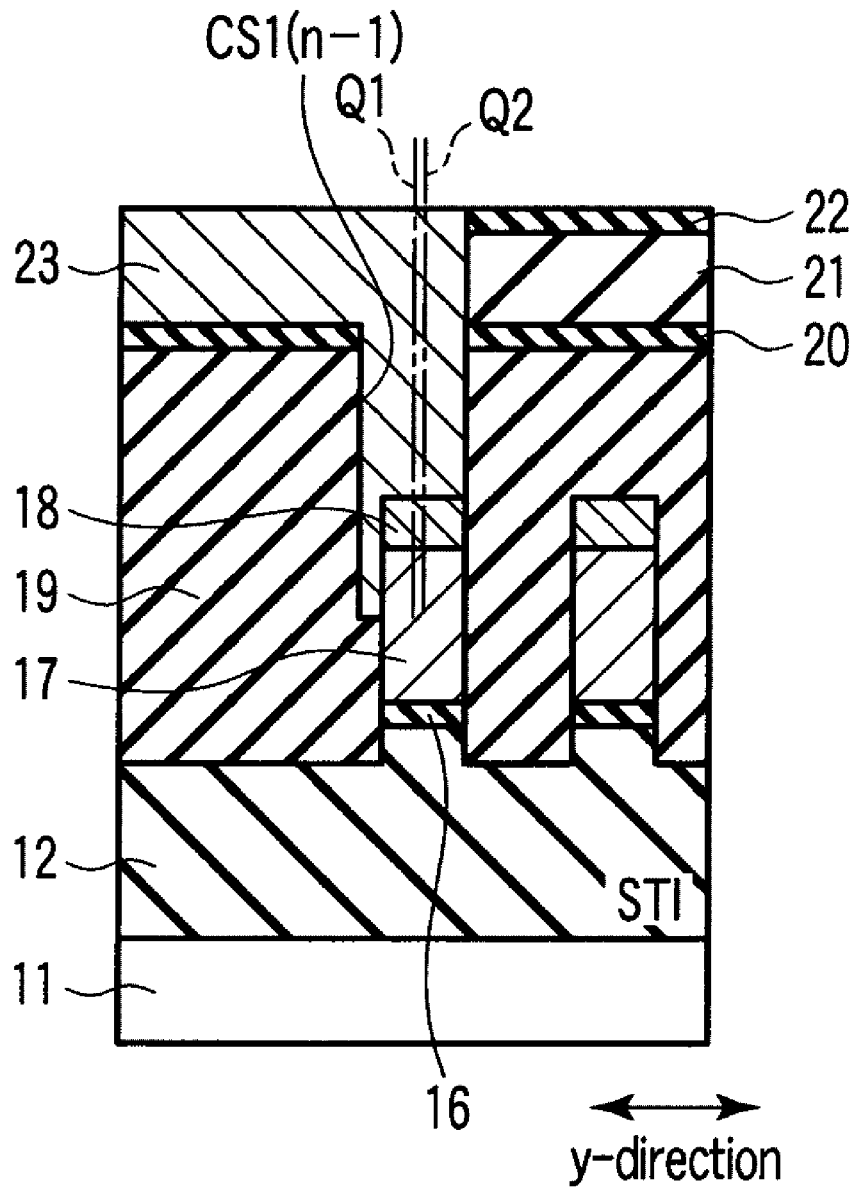
F I G. 7

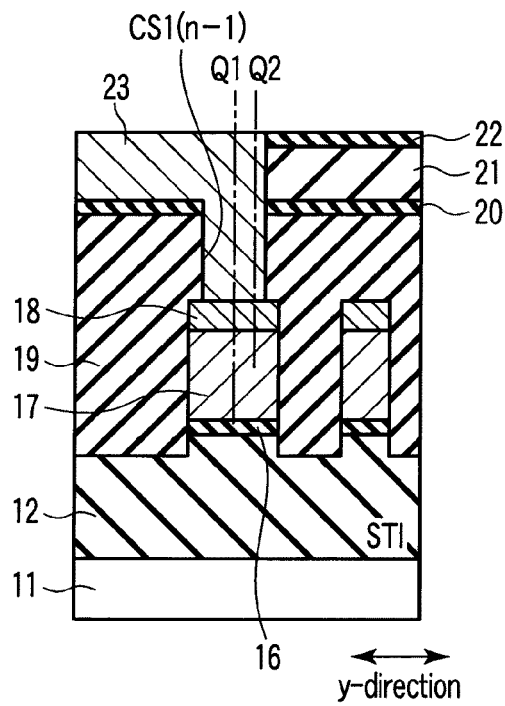
F I G. 11
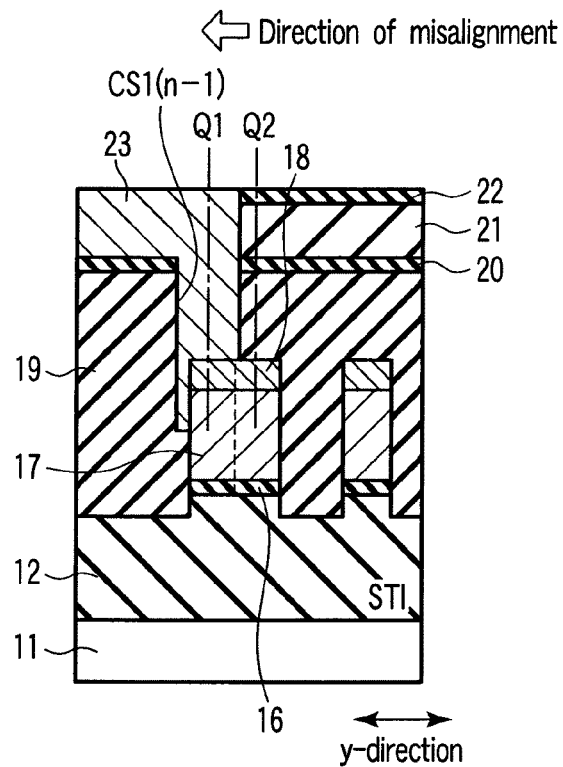
F I G. 12

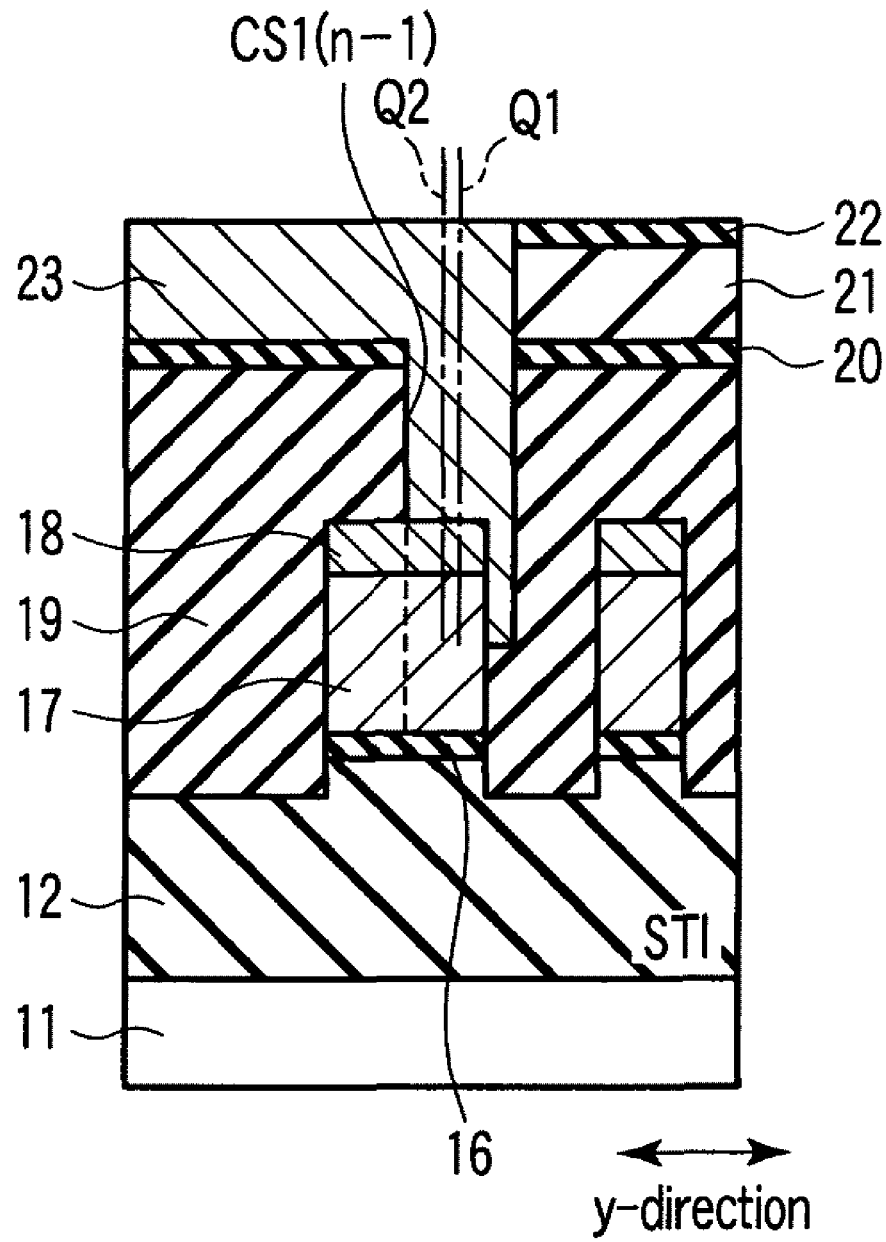
F I G. 13

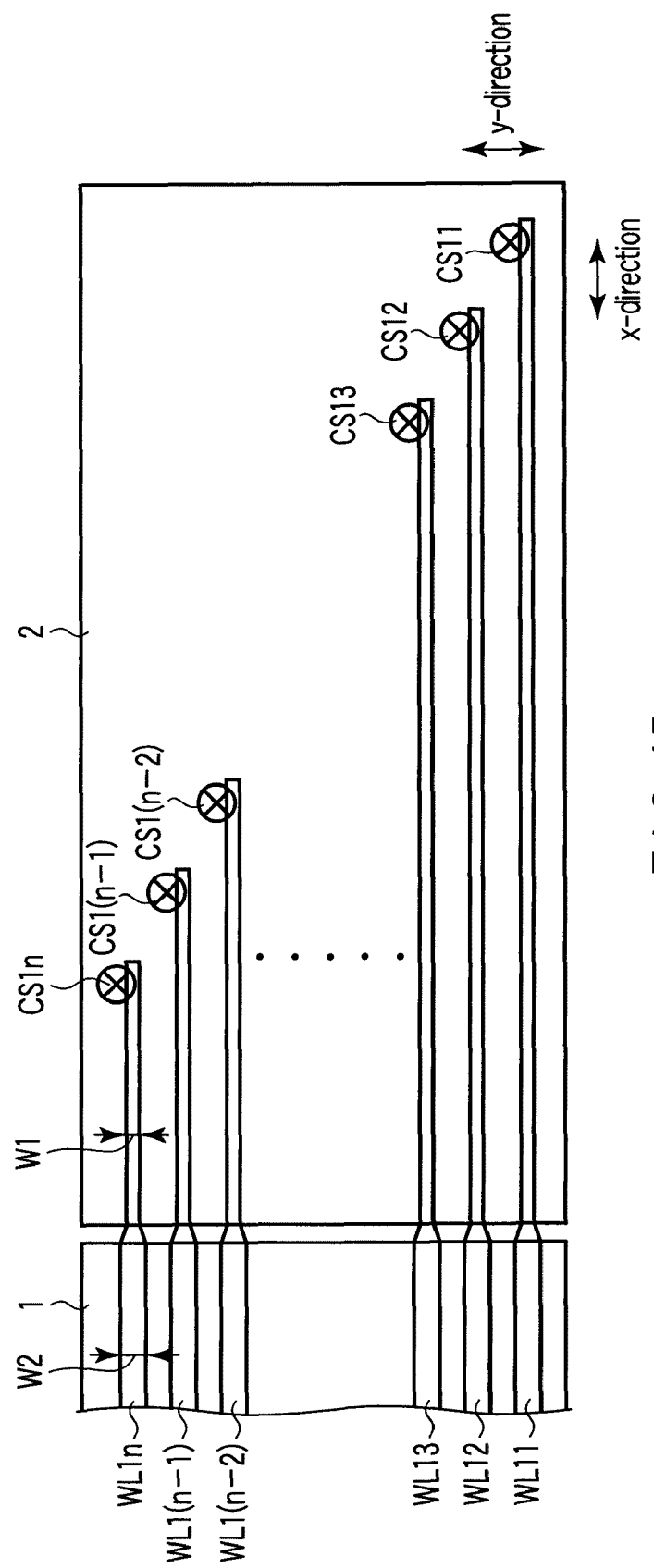
F I G. 15

MONOS type memory cell
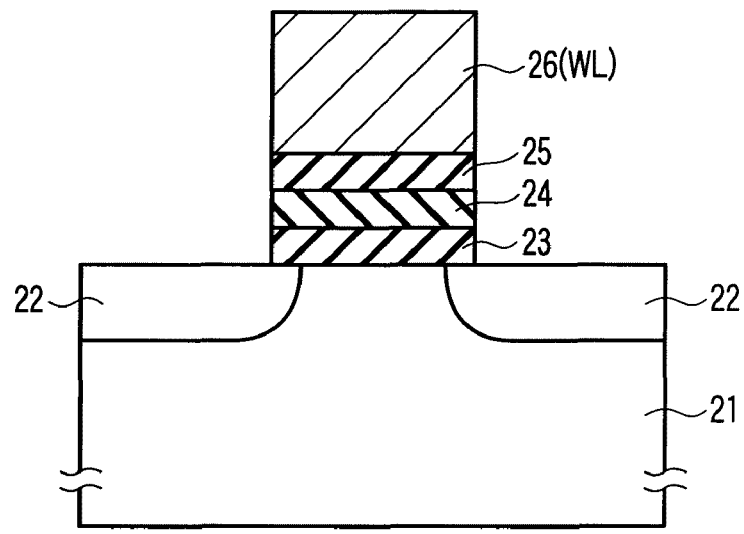
F I G. 17
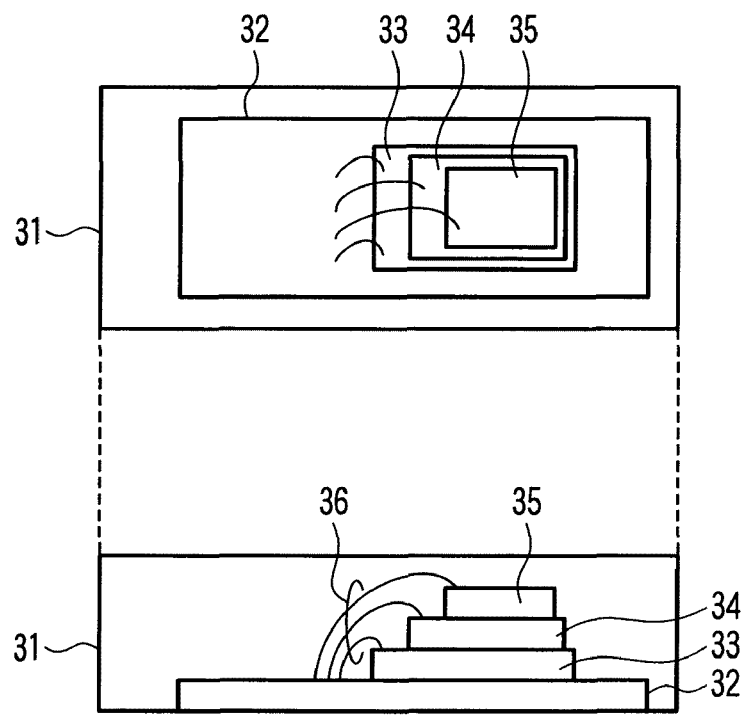
F I G. 18

SEMICONDUCTOR MEMORY

CROSS-REFERENCE TO RELATED APPLICATIONS

This application is a continuation of and claims the benefit of priority under 35 U.S.C. §120 from U.S. Ser. No. 12/164,486 filed Jun. 30, 2008, and claims the benefit of priority under 35 U.S.C. §119 from Japanese Patent Application No. 2007-174280 filed Jul. 2, 2007, the entire contents of each of which are incorporated herein by reference.

BACKGROUND OF THE INVENTION

1. Field of the Invention

The present invention relates to a contact hole structure with respect to a word line of a semiconductor memory.

2. Description of the Related Art

In recent years, many electronic devices using a NAND flash memory as a main storage memory have been produced commercially. On the other hand, improvement in capacity of storage capacity of a NAND flash memory is demanded as the function of an electronic device is varied, so that shrink of a memory cell and complication of a manufacturing process accompanied therewith result in the subject to be solved (for instance, refer to Jpn. Pat. Appln. KOKAI Publication Nos. 2002-184875, 5-88375, and 8-55920).

For instance, shrink of a memory cell conspicuously proceeds; however, in order to achieve improvement in reliability of the memory cell while eliminating problems such as cutting or short-circuiting of conductive lines or dispersion of contaminants caused by fabrication of the memory cells, with respect to conductive lines and contact holes, determination of sizes and pitches, or setting of processing condition should be performed in consideration of misalignment at the time of photolithography.

In addition, the word lines are formed with a feature size, which is a minimum size by a photolithography technique in each generation, by a pattern of lines and spaces. But, for instance, the conductive lines made of metal should be arranged on the word lines, and the conductive lines should be connected to the word lines via a contact hole in order to connect the word lines to a word line driver.

However, although with respect to the contact hole, examination on lateral displacement such as aligning accuracy at the time of the photolithography has been made sufficiently, examination on longitudinal displacement such as etching depth has not been made sufficiently.

In addition, practically, there occur many defects considered to be affected by depth of the contact holes with respect to the word lines, and therefore ascertaining the cause of the defects and developing a technology to solve it is an indispensable object.

Meanwhile, the same object occurs not only in the NAND flash memory but also in other semiconductor memories in which improvement in capacity of storage capacity is demanded.

BRIEF SUMMARY OF THE INVENTION

A semiconductor memory according to an aspect of the present invention comprises a memory cell array area having a memory cell, a word line contact area adjacent to the memory cell array area, a word line arranged straddling the memory cell array area and the word line contact area, a contact hole provided on the word line in the word line contact area, and a word line driver connected to the word line via the contact hole. A size of the contact hole is larger than a width of the word line, and the lowest parts of the contact hole exist on a position lower than a top surface of the word line and higher than a bottom surface of the word line.

BRIEF DESCRIPTION OF THE SEVERAL VIEWS OF THE DRAWING

FIG. 2 is a view showing a layout of a first embodiment;
FIG. 3 is a view showing an enlarged area P of FIG. 2;
FIG. 5 is a view showing a positional relationship between a word line and a contact hole;
FIG. 6 is a view showing a positional relationship between a word line and a contact hole;
FIG. 7 is a view showing a positional relationship between a word line and a contact hole;
FIG. 11 is a view showing a positional relationship between a word line and a contact hole;
FIG. 12 is a view showing a positional relationship between a word line and a contact hole;
FIG. 13 is a view showing a positional relationship between a word line and a contact hole;
FIG. 15 is a view showing an enlarged area P of FIG. 14;
FIG. 17 is a view showing a memory cell structure as a modified example;
FIG. 18 is a view showing a system as an application example.

DETAILED DESCRIPTION OF THE INVENTION

Figure 1:
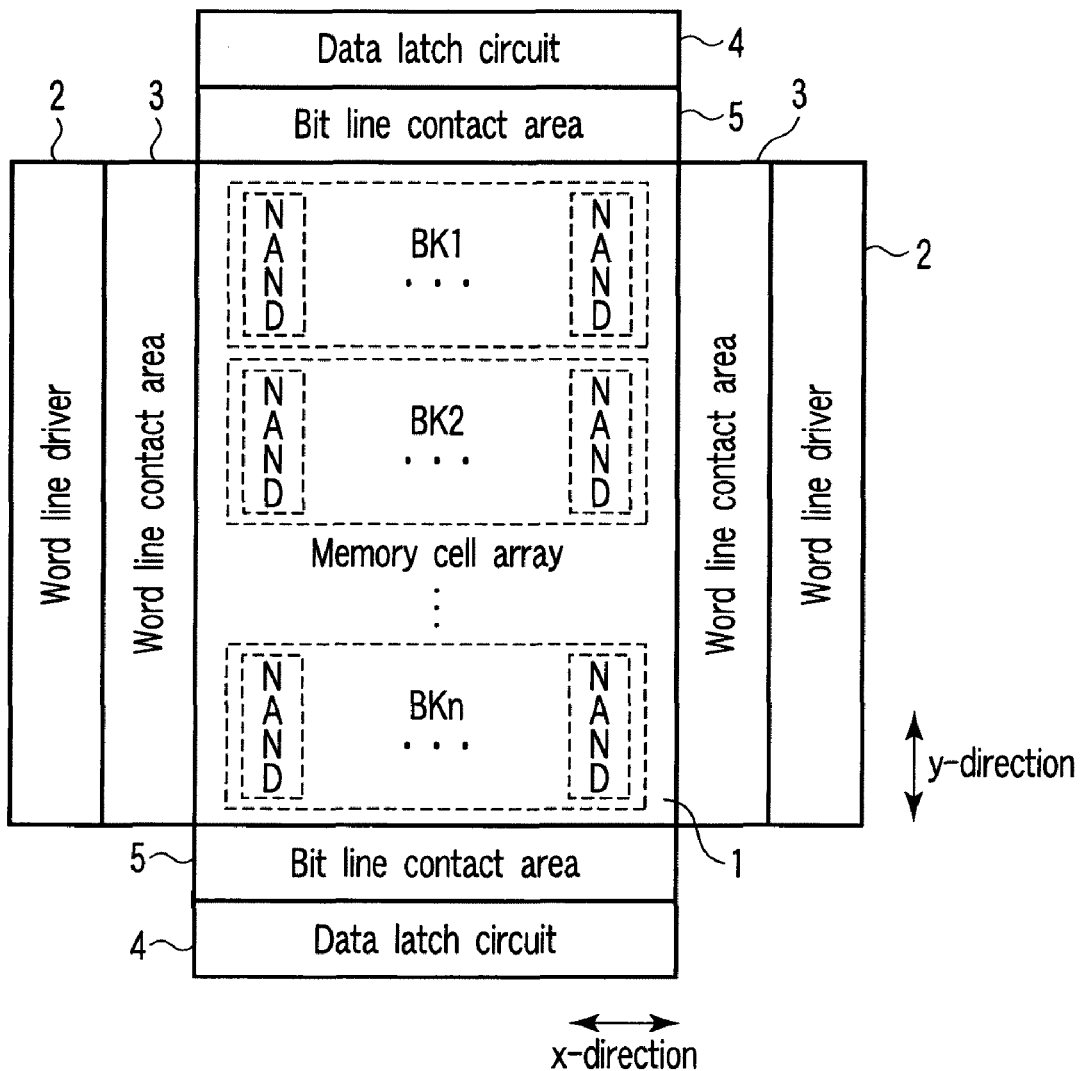
FIG. 1 is a view showing principal parts of a NAND flash memory.

A semiconductor memory of an aspect of the present invention will be described below in detail with reference to the accompanying drawings.

1. Outline

An example of the present invention is one in which, in a semiconductor memory whose contact hole size is larger than width of the word line, the lowest parts of the contact hole are set to a position lower than a top surface of the word line and higher than a bottom surface thereof.

First, as for the word lines, a sidewall processing technique is employed due to shrink of the memory cell. According to the technique, it is possible to realize the word line having a narrower width than a feature size of the photolithography. On the other hand, the size of the contact hole with respect to the word lines is determined by the feature size of the photolithography. For this reason, the size of the contact hole becomes larger than width of the word line.

There occurs a phenomenon that the deepest parts of the contact hole sink into a lower position than a top surface of the word line. Concerning the sinking, when investigating relation with ratio of defects of the semiconductor memory, it is found that the ratio of the defects becomes conspicuous when the deepest parts of the contact hole become lower than a bottom surface of the word line.

In addition, it is found that the cause of the sinking is the point that when removing a photoresist as an etching mask by a chemical liquid after the contact hole is formed, the chemical liquid dissolves a blocking insulating layer immediately below the word line and the dissolved material contaminates the surroundings of the word line.

Accordingly, in the example of the present invention, the lowest parts of the contact hole with respect to the word line are set to a position lower than the top surface of the word line and higher than its bottom surface.

Meanwhile, when employing the conventional process as it is, it is difficult to obtain such structure. This is because, if the contact hole with respect to the word line is opened simultaneously with the contact hole deeper than the former, that is, for instance, the contact hole with respect to a source/drain diffusion layer of MOSFET, naturally, the contact hole with respect to the word line also becomes deep.

From this situation, in the example of the present invention, a process is employed in which the contact hole with respect to the word line is opened independently of the other contact hole.

According to the example of the present invention, the problem of disconnection or short-circuiting of the word line caused by fluctuation in processes in the lateral direction is resolved by the sidewall processing technique, and further, the problem such as contaminants dispersion from the blocking insulating layer is resolved by controlling depth of the contact hole with respect to the word line.

In this manner, the semiconductor memory with high reliability is realized.

2. Embodiments

There will be described embodiments of the present invention with a NAND flash memory as an example.

(1) NAND Flash Memory

FIG. 1 shows principal part of the NAND flash memory.

Blocks BK1, BK2, . . . , BKn of n (n is a plural number) pieces lining up in the y-direction are arranged in a memory cell array area 1. The blocks BK1, BK2, . . . , BKn have a plurality of NAND cell units lining up in the x-direction.

A word line driver 2 drives the selected one word line in the selected one block BKi (i is one of 1 to n), for instance, at the time of read/write. The word line drivers 2 are respectively arranged at both ends of a memory cell array area 1 in the x-direction.

A word line contact area 3 for connecting the word line driver 2 to the word line in the memory cell array area 1 is arranged between the memory cell array area 1 and the word line driver 2.

A data latch circuit 4 has a function to latch the data temporarily, for instance, at the time of read/write. The data latch circuits 4 are respectively arranged at both ends of the memory cell array area 1 in the y-direction. This layout is effective for ABL (all bit line) sense principle.

A bit line contact area 5 for connecting the data latch circuit 4 to the bit line in the memory cell array area 1 is arranged between the memory cell array area 1 and the data latch circuit 4.

(2) First Embodiment

FIG. 2 shows a word line layout of the first embodiment.

A memory cell array area 1, a word line driver (DRV1, DRV2, DRV3 or DRV4) 2 and a word line contact area 3 correspond to the memory cell array area 1, the word line driver 2 and the word line contact area 3 of FIG. 1, respectively.

A plurality of active areas AA with lines & spaces structure is arranged in the memory cell array area 1. The active areas AA extend in the y-direction, and for instance an element isolation area formed of an element isolation insulating layer with a shallow trench isolation (STI) structure is arranged between them.

One or more active areas nearest to an end area of the memory cell array area 1 in the x-direction among the plurality of active areas AA is a dummy active area AA (DUMMY) which is not used for storage of the data.

In addition, a plurality of word lines WL11, WL12, . . . , WL1(n−2), WL1(n−1), WL1n, . . . with lines & spaces structure are arranged in the memory cell array area 1. The word lines WL11, WL12, . . . , WL1(n−2), WL1(n−1), WL1n, . . . extend in the x-direction in the memory cell array area 1 and both ends thereof exist in a word line leading area 3 between the memory cell area 1 and the word line driver 2.

The word line layout is such that as one end of the word lines WL11, WL12, . . . , WL1(n−2), WL1(n−1), WL1n, . . . heads to the word line nearest to the other end in the y-direction from the word line nearest to one end in the y-direction of one block BKj (j is 1, 2, 3, 4, . . . ), each one end of the word lines WL11, WL12, . . . , WL1(n−2), WL1(n−1), WL1n, . . . sequentially separates from the end area of the memory cell array area 1 in the x-direction.

In addition, each of contact holes CS11, CS12, . . . , CS1(n−2), CS1(n−1), CS1n, . . . is arranged on one end of the word lines WL11, WL12, . . . , WL1(n−2), WL1(n−1), WL1n, . . . .

The word line driver (DRV1, DRV2, DRV3, or DRV4) 2 is connected to one end of the word lines WL11, WL12, . . . , WL1(n−2), WL1(n−1), WL1n, . . . via each one of the contact holes CS11, CS12, . . . , CS1(n−2), CS1(n−1), CS1n, . . . .

Specifically, conductive lines L11, L12, . . . , L1(n−2), L1(n−1), L1n, . . . are arranged on the word lines WL11, WL12, . . . , WL1(n−2), WL1(n−1), WL1n, . . . .

One end of the conductive lines L11, L12, . . . , L1(n−2), L1(n−1), L1n, . . . is connected to the word line driver 2, while the other end thereof is connected to one end of the word lines WL11, WL12, . . . , WL1(n−2), WL1(n−1), WL1n, . . . via each one of the contact holes CS11, CS12, . . . , CS1(n−2), CS1(n−1), CS1n, . . . .

Width of the conductive lines L11, L12, . . . , L1(n−2), L1(n−1), L1n, . . . is wider than width of the word lines WL11, WL12, . . . , WL1(n−2), WL1(n−1), WL1n, . . . .

FIG. 3 shows an enlarged area P of FIG. 2.

The width of the word lines WL11, WL12, . . . , WL1(n−2), WL1(n−1), WL1n, . . . is approximately constant, and narrower than the feature size. In contrast, the contact holes CS11, CS12, . . . , CS1(n−2), CS1(n−1), CS1n, . . . result in the feature size or more.

Here, it is assumed that, when the contact hole is square, the size of the contact hole is the length of a side, when the contact hole is circular, the size of the contact hole is its diameter, and when the contact hole has other shapes, the size of the contact hole is the maximum width thereof.

The word lines WL11, WL12, . . . , WL1(n−2), WL1(n−1), WL1n, . . . have no fringe at parts where the contact holes CS11, CS12, . . . , CS1(n−2), CS1(n−1), CS1n, . . . are arranged.

In addition, a center point of the contact holes CS11, CS12, . . . , CS1(n−2), CS1(n−1), CS1n, . . . deviates to an upper side in the y-direction from a center line of the word lines WL11, WL12, . . . , WL1(n−2), WL1(n−1), WL1n, . . . .

In parts where the contact holes CS11, CS12, ..., CS1(n-2), CS1(n-1), CS1n, ... are arranged, the other word lines adjacent to the word lines WL11, WL12, ..., WL1(n-2), WL1(n-1), WL1n, ... in the memory cell array do not exist in the direction (upper side of the y-direction) towards which the contact holes CS11, CS12, ..., CS1(n-2), CS1(n-1), CS1n, ... deviate from the center line of the word lines WL11, WL12, ..., WL1(n-2), WL1(n-1), WL1n, ....

Figure 4:
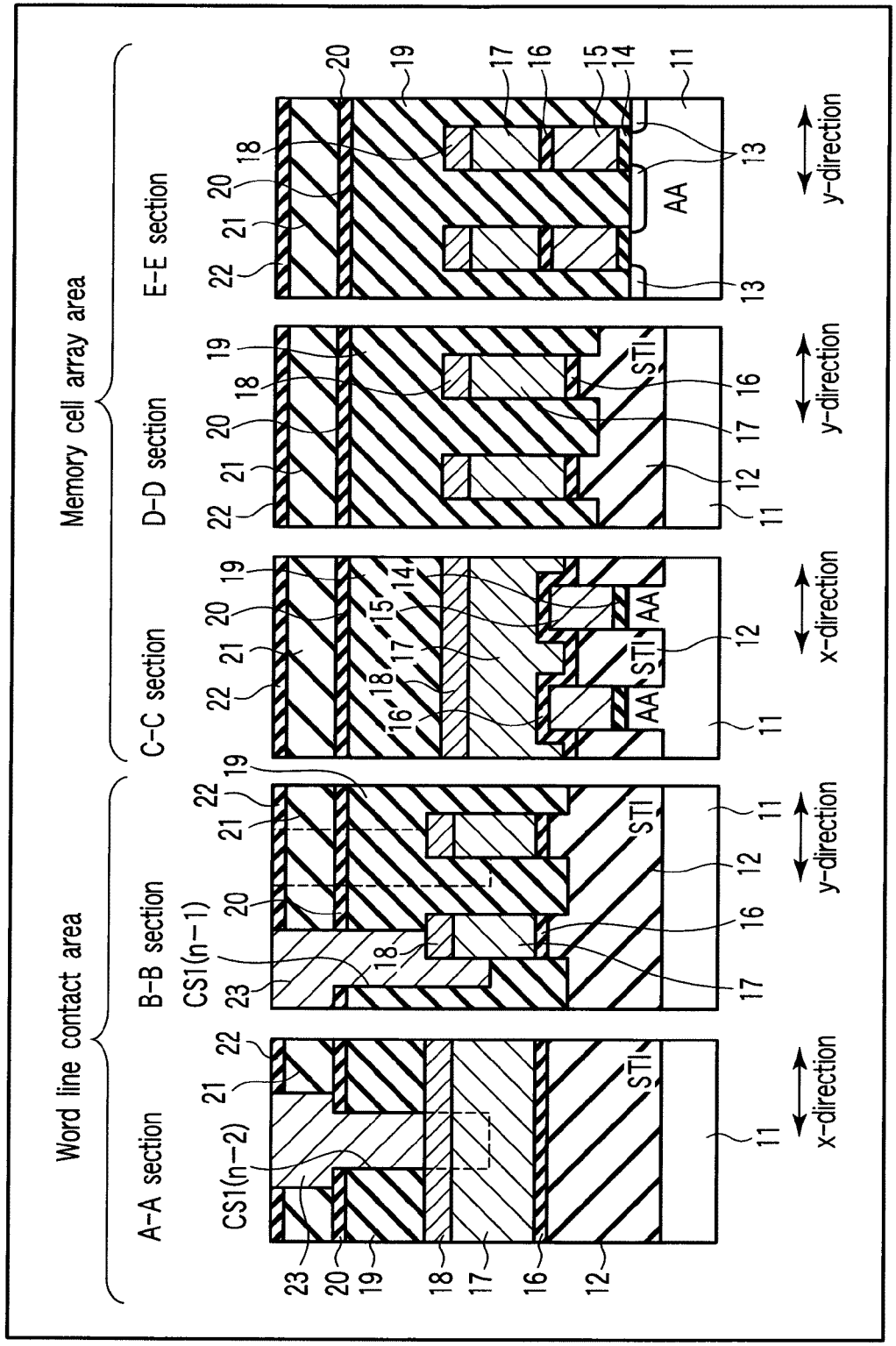
FIG. 4 is a view showing a cross-sectional structure of a device.

FIG. 4 shows cross-sectional views along line A-A, line B-B, line C-C, line D-D, and line E-E of FIGS. 2 and 3.

An element isolation insulating layer 12 with an STI structure is arranged in a semiconductor substrate 11. The element isolation insulating layer 12 is constituted of, for instance, silicon oxide, and its width is set to a value in the range of 0.1 to 0.5 μm.

In the memory cell array area, a source/drain diffusion layer 13 is arranged in the active area AA surrounded by the element isolation insulating layer 12. A gate insulating film (tunnel insulating film) 14, a floating gate electrode (charge storage layer) 15, an inter-gate insulating film (blocking insulating layer) 16 and a control gate electrodes (word lines) 17, 18 are arranged on a channel region between the source/drain diffusion layers 13.

The inter-gate insulating film 16 is constituted of, for instance, an oxide/nitride/oxide (ONO) film, a high-k film or the like. The inter-gate insulating film 16 is called an inter-polysilicon dielectric (IPD) when the floating gate electrode 15 and the control gate electrode 17 are constituted respectively of conductive polysilicon.

The control gate electrode 18 is constituted of a metal silicide film in order to lower a resistance value of the control gate electrode 17, when the control gate electrode 17 is constituted of the conductive polysilicon.

In the word line contact area, the word lines (control gate electrode) 17, 18 are arranged via the inter-gate insulating film 16 on the element isolation insulating layer 12.

The word lines 17, 18 are covered by an interlayer insulating film 19 formed of the silicon oxide or the like.

Insulating films 20, 21, and 22 are arranged on the interlayer insulating film 19.

The insulating film 21 is constituted of, for instance, the silicon oxide, while the insulating films 20, 22 are constituted of, for instance, silicon nitride. The insulating films 21 to 23 function as an etching stopper in steps of RIE, CMP or the like.

In the insulating film 21, a wiring trench is provided, while in the interlayer insulating film 19, the contact holes CS1(n-2), CS1(n-1) reaching the word lines 17, 18 are provided.

The lowest parts of the contact holes CS1(n-2), CS1(n-1) exist on a position lower than the top surface of the word lines 17, 18 and higher than the bottom surface thereof. That is, since the inter-gate insulating film 16 is not exposed in the contact holes CS1(n-2), CS1(n-1), it is possible to prevent contamination by dissolution of the inter-gate insulating film 16.

Then, the wiring trench and the contact hole are filled with the conductive line 23 corresponding to the conductive lines L11, L12 ..., L1(n-2), L1(n-1), L1n, ... of FIGS. 2 and 3.

FIGS. 5 to 7 show positional relationship between the word lines and the contact holes in the word line contact area.

The example of FIG. 5 shows no misalignment by the photolithography between the word lines 17, 18 and the contact hole CS1(n-1). The center point Q1 of the contact hole CS1(n-1) deviates to left side in the y-direction (corresponding to upper side in the y-direction of FIGS. 2 and 3) from the center line Q2 of the word lines 17, 18.

Here, as shown in FIG. 6, even though the center point Q1 of the contact hole CS1(n-1) further deviates to left side in the y-direction due to misalignment by the photolithography, since the other word lines adjacent to the word lines 17, 18 do not exist in the contact hole deviating direction (left side in the y-direction), problems of short circuiting between the word lines do not occur.

In addition, as shown in FIG. 7, even though the center point Q1 of the contact hole CS1(n-1) deviates to right side in the y-direction due to misalignment by the photolithography, since the center point Q1 of the contact hole CS1(n-1) originally deviates to left side in the y-direction from the center line Q2 of the word lines 17, 18 in the condition that there is no misalignment by the photolithography, the problem of the short circuiting between the word lines does not occur.

Further, since opening of the contact hole CS1(n-1) is performed independently (in separate process) of the opening of the contact hole other than the contact hole with respect to the word line, it is possible to set the lowest parts of the contact hole CS1(n-1) lower than the top surface of the word lines 17, 18 and higher than the bottom surface thereof.

For this reason, the inter-gate insulating film 16 is not dissolved by the chemical liquid for peeling the photoresist after formation of the contact hole CS1(n-1).

Therefore, contamination caused by dissolved material of the inter-gate insulating film 16 disappears, and thus, it is possible to realize improvement of element characteristics due to securement of dielectric strength or the like between word lines.

(3) Second Embodiment

The present invention is applicable to all semiconductor memories regardless of whether or not the fringe is provided to the word line. This is because, even if the fringe exists, the sinking of the contact hole can occur due to the misalignment of the photolithography.

In this embodiment, there will be described a NAND flash memory having the fringe on the word line immediately below the contact hole.

Figure 8:
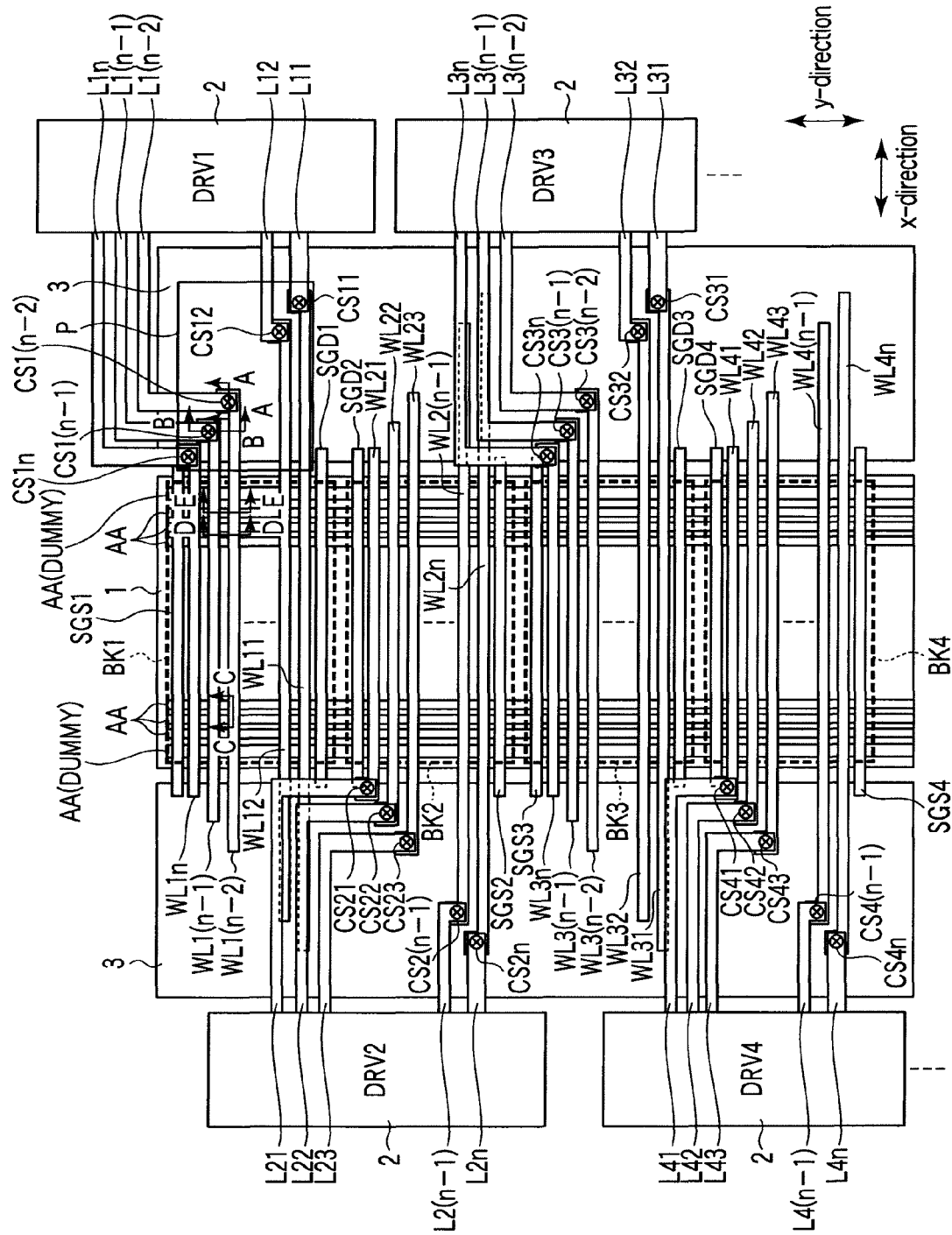
FIG. 8 is a view showing a layout of a second embodiment.

FIG. 8 shows the word line layout of the second embodiment.

A memory cell array area 1, a word line driver (DRV1, DRV2, DRV3 or DRV4) 2 and a word line contact area 3 correspond to the memory cell array area 1, the word line driver 2 and the word line contact area 3 of FIG. 1, respectively.

A plurality of active areas AA with lines & spaces structure is arranged in the memory cell array area 1. The active areas AA extend in the y-direction, and for instance an element isolation area formed of an element isolation insulating layer with a shallow trench isolation (STI) structure is arranged between them.

One or more active areas nearest to an end area of the memory cell array area 1 in the x-direction among the plurality of active areas AA is a dummy active area AA (DUMMY) which is not used for storage of the data.

In addition, a plurality of word lines WL11, WL12, ..., WL1(n-2), WL1(n-1), WL1n, ... with lines & spaces structure are arranged in the memory cell array area 1. The word lines WL11, WL12, ..., WL1(n-2), WL1(n-1), WL1n, ... extend in the x-direction in the memory cell array area 1 and both ends thereof exist in a word line leading area 3 between the memory cell array area 1 and the word line driver 2.

The word line layout is such that as one end of the word lines WL11, WL12, ..., WL1(n-2), WL1(n-1), WL1n, ... heads toward the word line nearest to the other end in the y-direction from the word line nearest to one end in the y-direction of one block BKj (j is 1, 2, 3, 4, . . . ), each one end of the word lines WL11, WL12, . . . , WL1(n−2), WL1(n−1), WL1n, . . . sequentially separates from the end area of the memory cell array area 1 in the x-direction.

In addition, a fringe is provided to each one end of the word lines WL11, WL12, . . . , WL1(n−2), WL1(n−1), WL1n, . . . , and each of the contact holes CS11, CS12, . . . , CS1(n−2), CS1(n−1), CS1n, . . . is arranged on the fringe.

The word line driver (DRV1, DRV2, DRV3, or DRV4) 2 is connected to one end of the word lines WL11, WL12, . . . , WL1(n−2), WL1(n−1), WL1n, . . . via each of the contact holes CS11, CS12, . . . , CS1(n−2), CS1(n−1), CS1n, . . . .

Specifically, conductive lines L11, L12, . . . , L1(n−2), L1(n−1), L1n, . . . are arranged on the word lines WL11, WL12, . . . , WL1(n−2), WL1(n−1), WL1n, . . . .

One end of the conductive lines L11, L12, . . . , L1(n−2), L1(n−1), L1n, . . . is connected to the word line driver 2, while the other end thereof is connected to one end of the word lines WL11, WL12, . . . , WL1(n−2), WL1(n−1), WL1n, . . . via each of the contact holes CS11, CS12, . . . , CS1(n−2), CS1(n−1), CS1n, . . . .

Width of the conductive lines L11, L12, . . . , L1(n−2), L1(n−1), L1n, . . . is wider than width of the word lines WL11, WL12, . . . , WL1(n−2), WL1(n−1), WL1n, . . . .

Figure 9:
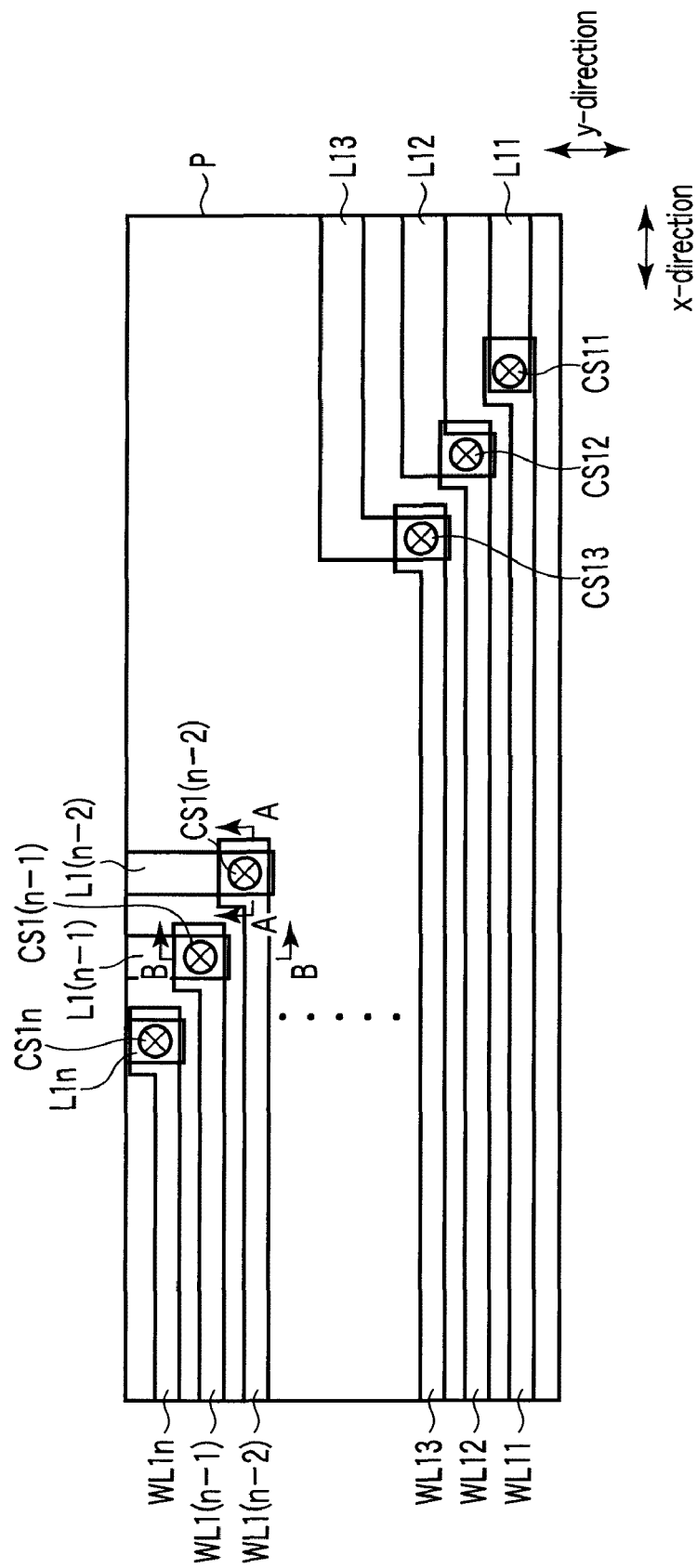
FIG. 9 is a view showing an enlarged area P of FIG. 8.

FIG. 9 shows an enlarged area P of FIG. 8.

The word lines WL11, WL12, . . . , WL1(n−2), WL1(n−1), WL1n, . . . are formed by the sidewall processing process, and the width is approximately constant and narrower than the feature size. In contrast, the contact holes CS11, CS12, . . . , CS1(n−2), CS1(n−1), CS1n, . . . result in the feature size or more.

The word lines WL11, WL12, . . . , WL1(n−2), WL1(n−1), WL1n, . . . have fringes at parts where the contact holes CS11, CS12, . . . , CS1(n−2), CS1(n−1), CS1n, . . . are arranged.

In addition, a center point of the contact holes CS11, CS12, . . . , CS1(n−2), CS1(n−1), CS1n, . . . deviates to an upper side in the y-direction from a center line of the word lines WL11, WL12, . . . , WL1(n−2), WL1(n−1), WL1n, . . . .

In parts where the contact holes CS11, CS12, . . . , CS1(n−2), CS1(n−1), CS1n, . . . are arranged, the other word lines adjacent to the word lines WL11, WL12, . . . , WL1(n−2), WL1(n−1), WL1n, . . . in the memory cell array do not exist in the direction in which the fringe is provided, that is, in the direction (upper side of the y-direction) towards which the contact holes CS11, CS12, . . . , CS1(n−2), CS1(n−1), CS1n, . . . deviate from the center line of the word lines WL11, WL12, . . . , WL1(n−2), WL1(n−1), WL1n, . . . .

Figure 10:
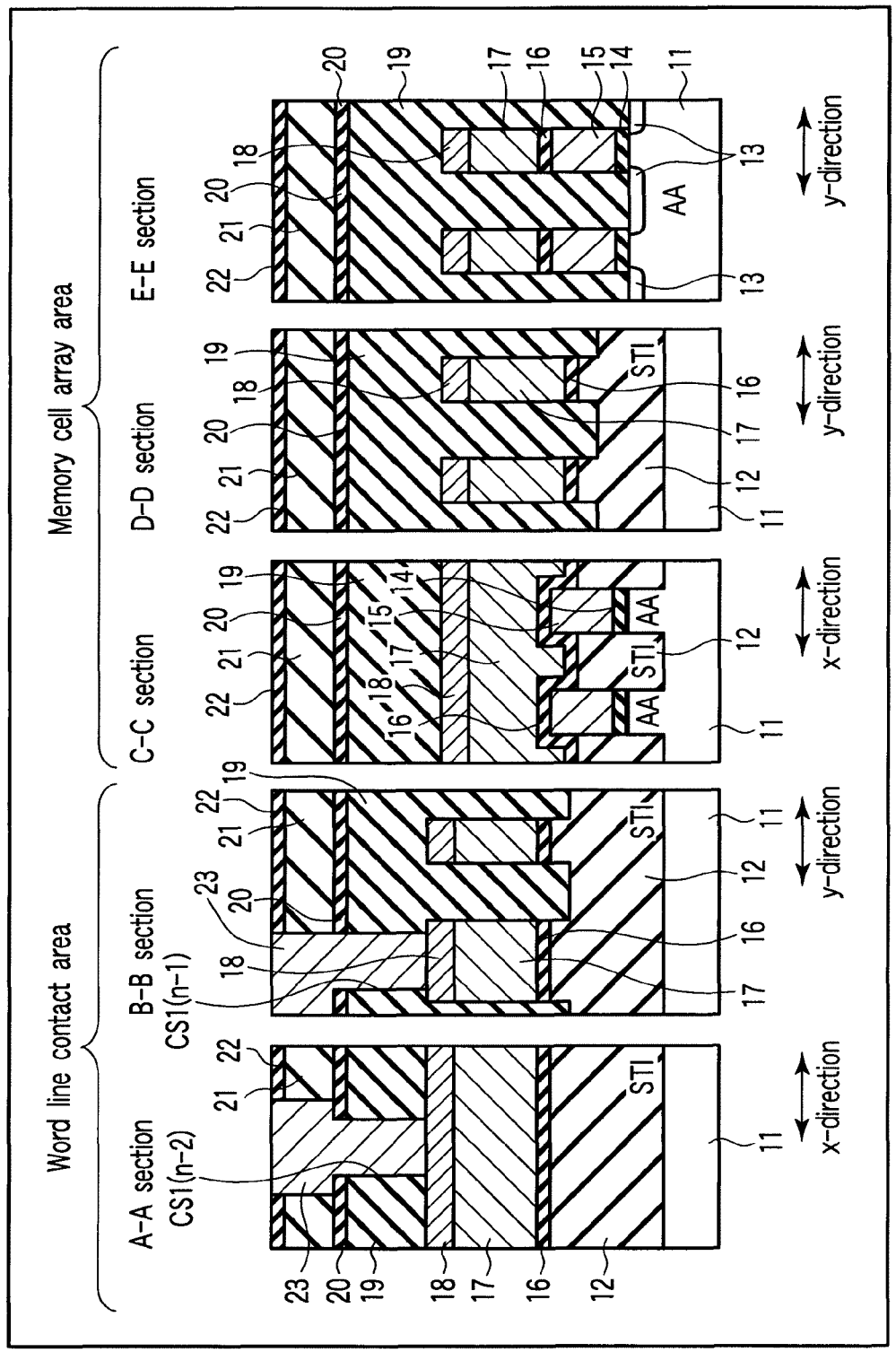
FIG. 10 is a view showing a cross-sectional structure of a device.

FIG. 10 shows cross-sectional views along line A-A, line B-B, line C-C, line D-D, and line E-E of FIGS. 8 and 9.

The element isolation insulating layer 12 with STI structure is arranged in a semiconductor substrate 11. The element isolation insulating layer 12 is constituted of, for instance, silicon oxide, and its width is set to a value within the range of 0.1 to 0.5 µm.

In the memory cell array area, a source/drain diffusion layer 13 is arranged in the active area AA surrounded by the element isolation insulating layer 12. A gate insulating film (tunnel insulating film) 14, a floating gate electrode (charge storage layer) 15, an inter-gate insulating film (blocking insulating layer) 16 and control gate electrodes (word lines) 17, 18 are arranged on a channel region between the source/drain diffusion layers 13.

The inter-gate insulating film 16 is constituted of, for instance, an oxide/nitride/oxide (ONO) film, a high-k film or the like. The inter-gate insulating film 16 is called an inter-polysilicon dielectric (IPD) when the floating gate electrode 15 and the control gate electrode 17 are constituted respectively of conductive polysilicon.

The control gate electrode 18 is constituted of a metal silicide film in order to lower a resistance value of the control gate electrode 17, when the control gate electrode 17 is constituted of the conductive polysilicon.

In the word line contact area, the word lines (control gate electrode) 17, 18 are arranged via the inter-gate insulating film 16 on the element isolation insulating layer 12.

The word lines 17, 18 are covered by an interlayer insulating film 19 formed of the silicon oxide or the like.

Insulating films 20, 21, and 22 are arranged on the interlayer insulating film 19.

The insulating film 21 is constituted of, for instance, the silicon oxide, while the insulating films 20, 22 are constituted of, for instance, silicon nitride. The insulating films 21 to 23 function as an etching stopper in steps of RIE, CMP or the like.

In the insulating film 21, a wiring trench is provided, while in the interlayer insulating film 19, the contact holes CS1(n−2), CS1(n−1) reaching the word lines 17, 18 are provided.

Then, the wiring trench and the contact hole are filled with the conductive line 23 corresponding to the conductive lines L11, L12, . . . , L1(n−2), L1(n−1), L1n, . . . of FIGS. 8 and 9.

FIGS. 11 to 13 show positional relationship between the word lines and the contact holes in the word line contact area.

The example of FIG. 11 shows no misalignment by the photolithography between the word lines 17, 18 and the contact hole CS1(n−1). The contact hole CS1(n−1) is positioned on the fringe of the word lines 17, 18.

Here, as shown in FIG. 12, when the center point Q1 of the contact hole CS1(n−1) deviates to the left side in the y-direction due to the misalignment by the photolithography, the sinking of the contact hole CS(n−1) occurs.

However, the lowest parts of the contact hole CS1(n−1) exist lower than the top surface of the word lines 17, 18 and higher than the bottom surface thereof. That is, since the inter-gate insulating film 16 is not exposed in the contact hole CS1(n−1), it is possible to prevent contamination caused by dissolution of the inter-gate insulating film 16.

Since the other word lines adjacent to the word lines 17, 18 do not exist in the contact hole CS1(n−1) deviating direction (left side in the y-direction), problems of short circuiting between the word lines do not occur.

Next, as shown in FIG. 13, when the center point Q1 of the contact hole CS1(n−1) deviates to the right side in the y-direction due to the misalignment by the photolithography, similarly, the sinking of the contact hole CS1(n−1) occurs.

However, the lowest parts of the contact hole CS1(n−1) exist on a position lower than the top surface of the word lines 17, 18 and higher than the bottom surface thereof. That is, since the inter-gate insulating film 16 is not exposed in the contact hole CS1(n−1), it is possible to prevent contamination caused by dissolution of the inter-gate insulating film 16.

In addition, since the center point Q1 of the contact hole CS1(n−1) originally deviates to left side in the y-direction from the center line Q2 of the word lines 17, 18 under the condition that there is no misalignment by the photolithography, the problem of the short circuiting between the word lines does not occur.

(4) Third Embodiment

The third embodiment is a modified example of the first embodiment.

A characteristic of the embodiment lies in a point that width of the word line at parts where the contact hole is arranged is narrower than width of the word line in the memory cell array area.

Figure 14:
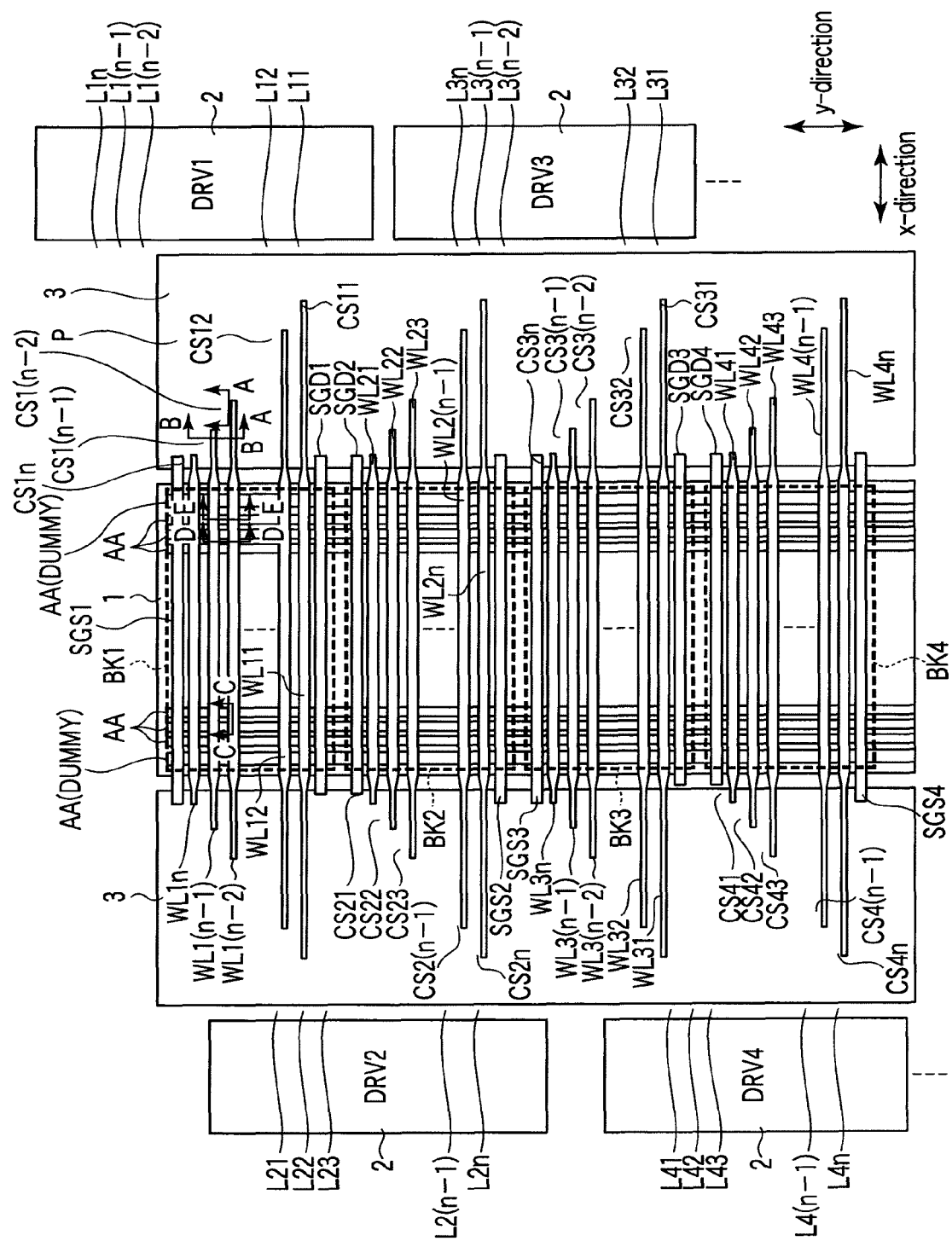
FIG. 14 is a view showing a layout of a third embodiment.

FIG. 14 shows a word line layout of the third embodiment.

A memory cell array area 1, a word line driver (DRV1, DRV2, DRV3 or DRV4) 2 and a word line contact area 3 correspond to the memory cell array area 1, the word line driver 2 and the word line contact area 3 of FIG. 1, respectively.

A plurality of active areas AA with lines & spaces structure is arranged in the memory cell array area 1. The active areas AA extend in the y-direction, and for instance an element isolation area formed of an element isolation insulating layer with a shallow trench isolation (STI) structure is arranged between them.

One or more active areas nearest to an end area of the memory cell array area 1 in the x-direction among the plurality of active areas AA is a dummy active area AA (DUMMY) which is not used for storage of the data.

In addition, a plurality of word lines WL11, WL12, ..., WL1(n−2), WL1(n−1), WL1n, ... with lines & spaces structure are arranged in the memory cell array area 1. The word lines WL11, WL12, ..., WL1(n−2), WL1(n−1), WL1n, ... extend in the x-direction in the memory cell array area 1 and both ends thereof exist in a word line leading area 3 between the memory cell array area 1 and the word line driver 2.

The word line layout is such that as one end of the word lines WL11, WL12, ..., WL1(n−2), WL1(n−1), WL1n, ... heads to the word line nearest to the other end in the y-direction from the word line nearest to one end in the y-direction of one block BKj (j is 1, 2, 3, 4, ... ), each one end of the word lines WL11, WL12, ..., WL1(n−2), WL1(n−1), WL1n, ... sequentially separates from the end area of the memory cell array area 1 in the x-direction.

In addition, each of the contact holes CS11, CS12, ..., CS1(n−2), CS1(n−1), CS1n, ... is arranged on one end of the word lines WL11, WL12, ..., WL1(n−2), WL1(n−1), WL1n, ....

Further, width of the word lines WL11, WL12, WL1(n−2), WL1(n−1), WL1n, ... at parts where the contact holes CS11, CS12, ..., CS1(n−2), CS1(n−1), CS1n, ... are arranged is narrower than width of the word lines WL11, WL12, ..., WL1(n−2), WL1(n−1), WL1n, ... in the memory cell array area 1.

The conductive lines L11, L12, ..., L1(n−2), L1(n−1), L1n, ... are arranged on the word lines WL11, WL12, ..., WL1(n−2), WL1(n−1), WL1n, ....

One end of the conductive lines L11, L12, ... L1(n−2), L1(n−1), L1n, ... is connected to the word line driver 2, while the other end thereof is connected to one end of the word lines WL11, WL12, ..., WL1(n−2), WL1(n−1), WL1n, ... via each of the contact holes CS11, CS12, ..., CS1(n−2), CS1(n−1), CS1n, ....

Width of the conductive lines L11, L12, ..., L1(n−2), L1(n−1), L1n, ... is wider than width of the word lines WL11, WL12, ..., WL1(n−2), WL1(n−1), WL1n, ....

FIG. 15 shows an enlarged area P of FIG. 14.

The width of the word lines WL11, WL12, ..., WL1(n−2), WL1(n−1), WL1n, ... at parts where the contact holes CS11, CS12, ..., CS1(n−2), CS1(n−1), CS1n, ... are arranged is narrower than width of the word lines WL11, WL12, ..., WL1(n−2), WL1(n−1), WL1n, ... in the memory cell array area 1.

In addition, size of the contact holes CS11, CS12, ..., CS1(n−2), CS1(n−1), CS1n, ... is at least larger than width of the word lines WL11, WL12, ..., WL1(n−2), WL1(n−1), WL1n, ... of parts where the contact holes CS11, CS12, ..., CS1(n−2), CS1(n−1), CS1n, ... are arranged.

The word lines WL11, WL12, ..., WL1(n−2), WL1(n−1), WL1n, ... have no the fringe at the parts where the contact holes CS11, CS12, ..., CS1(n−2), CS1(n−1), CS1n, ... are arranged.

In addition, the center point of the contact holes CS11, CS12, ..., CS1(n−2), CS1(n−1), CS1n, ... deviates to the upper side in the y-direction from the center line of the word lines WL11, WL12, ..., WL1(n−2), WL1(n−1), WL1n, ....

In parts where the contact holes CS11, CS12, ..., CS1(n−2), CS1(n−1), CS1n, ... are arranged, the other word lines adjacent to the word lines WL11, WL12, ..., WL1(n−2), WL1(n−1), WL1n, ... do not exist in the direction (upper side in the y-direction) toward which the contact holes CS11, CS12, ..., CS1(n−2), CS1(n−1), CS1n, ... deviate from the center line of the word lines WL11, WL12, ..., WL1(n−2), WL1(n−1), WL1n, ....

Meanwhile, since the cross-sectional structure of the device and the positional relationship between the word lines and the contact holes are the same as those of the first embodiment (FIGS. 4 to 7), here, description thereof is omitted.

(5) Conclusion

As described above, according to the embodiment, reliability of the NAND flash memory can be improved by a novel contact hole structure with respect to the word lines.

3. Modified Example

Figure 16:
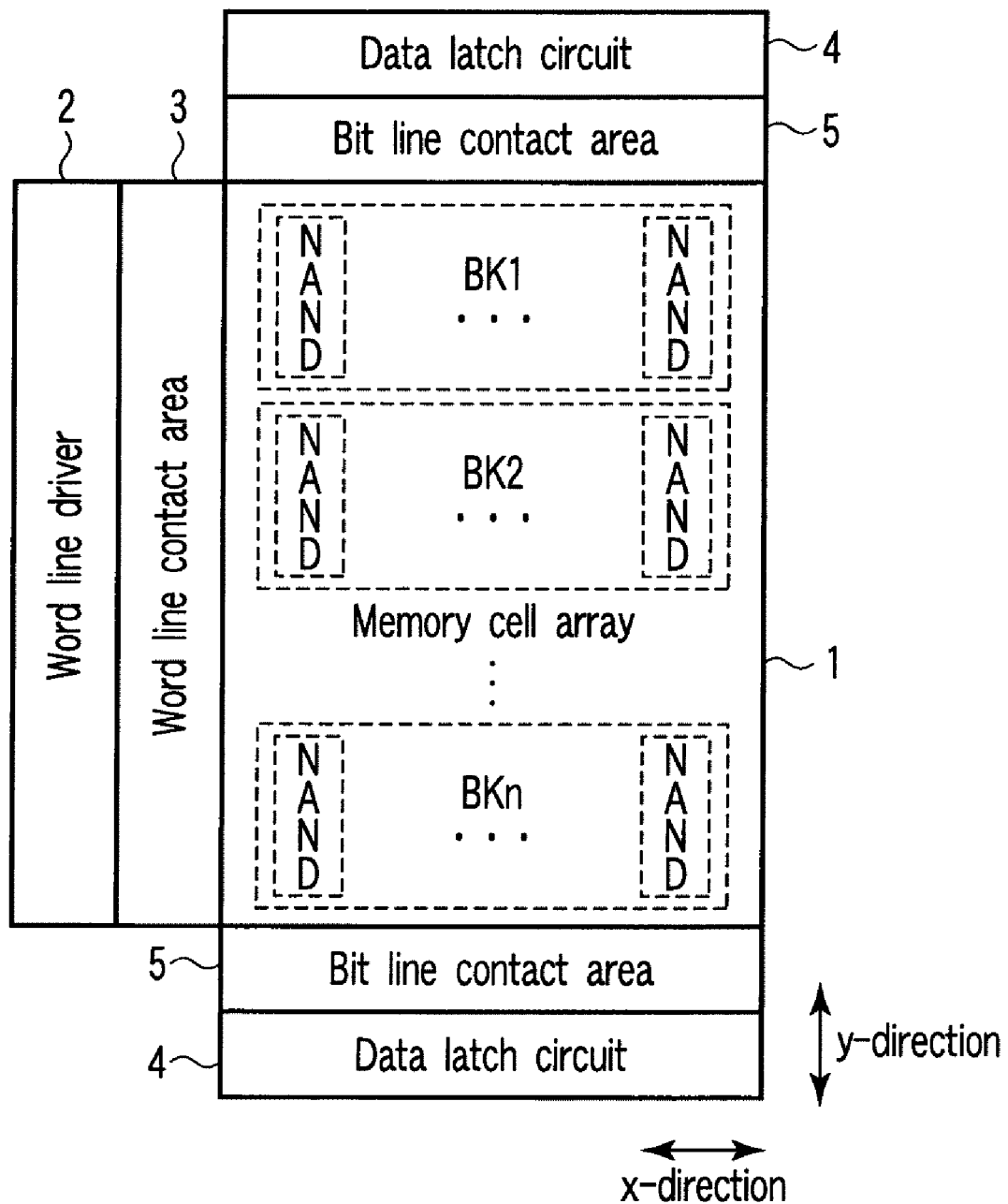
FIG. 16 is a view showing principal parts of a NAND flash memory as a modified example.

FIG. 16 shows principal parts of the NAND flash memory as a modified example.

This characteristic lies in a point that the word line driver 2 and the word line contact area 3 are arranged at only one end in the x-direction of the memory cell array area 1.

As the word line layout and the contact hole structure, one of the above first to third embodiments can be applied.

However, since the word line driver 2 and the word line contact area 3 are arranged at only one end of the memory cell array area 1, the layout of the word lines at the other end of the memory cell array area 1 can be set freely.

That is, positions of the pointed heads of all the word lines can be equal, for example, distance from the memory cell array area 1 can be equal for all the word lines.

FIG. 17 shows a memory cell structure as the modified example.

This memory cell is of the MONOS type.

Here, it is assumed that the MONOS type is the nonvolatile semiconductor memory whose charge storage layer is constituted of the insulating film.

A source/drain diffusion layer 22 is arranged in a semiconductor substrate (active area) 21. A gate insulating film (tunnel insulating film) 23, a charge storage layer 24, a blocking insulating film 25 and a control gate electrode (word line) 26 are arranged on a channel region between the source/drain diffusion layers 22.

The blocking insulating film 25 is constituted of, for instance, an oxide/nitride/oxide (ONO) film, high-k film or the like.

Also, in the word line contact area, the word line (control gate electrode) 26 is arranged on the element isolation insulating layer via the blocking insulating film 25.

4. Application Example

There will be described an example of a system to which the semiconductor memory of the present invention is applied.

FIG. 18 shows one example of a memory system.

This system is, for instance, a memory card, a USB memory or the like.

A circuit substrate 32, a plurality of semiconductor chips 33, 34, and 35 are arranged in a package 31. The circuit substrate 32 and the semiconductor chips 33, 34, and 35 are electrically connected with a bonding wire 36. One of the semiconductor chips 33, 34, and 35 is the semiconductor memory according to the present invention.

Figure 19:
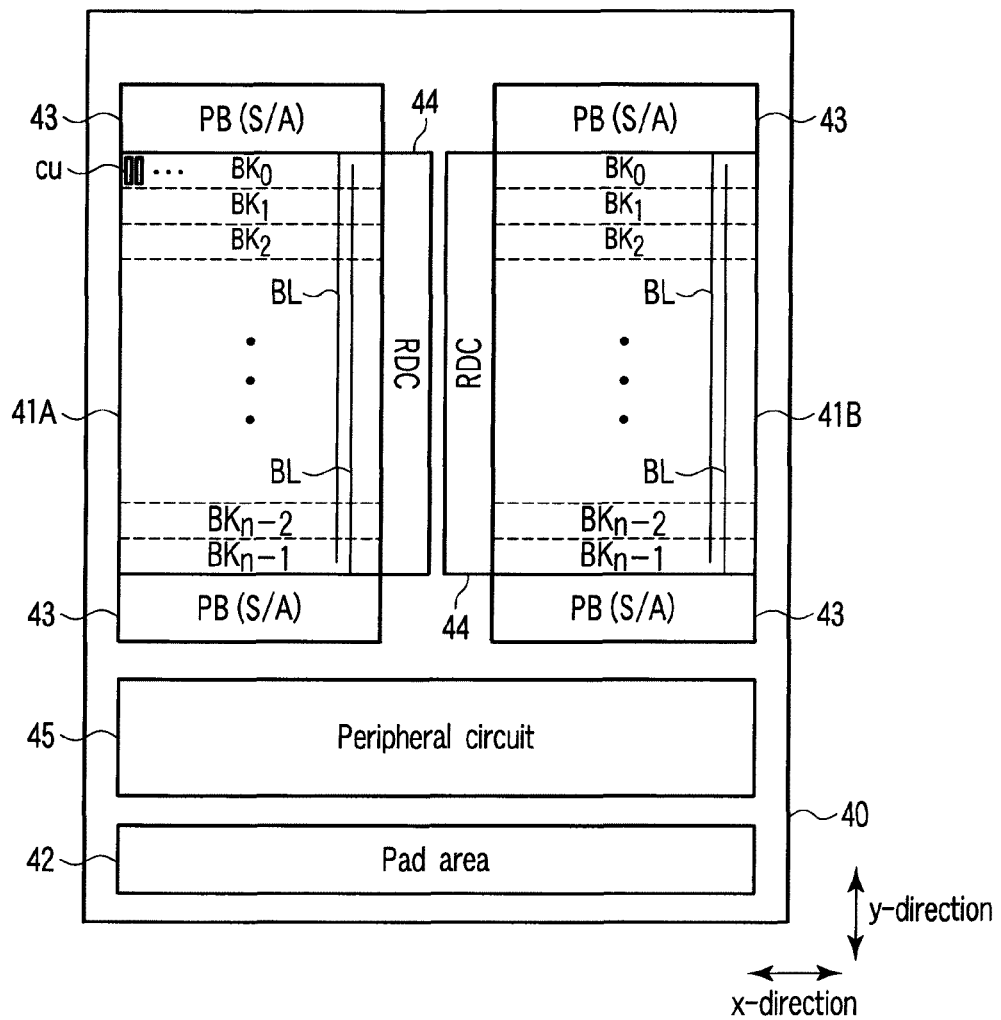
FIG. 19 is a view showing a layout of a semiconductor memory as an application example.

FIG. 19 shows a chip layout of the semiconductor memory as the application example.

Memory cell arrays 41A, 41B are arranged on a semiconductor chip 40. The memory cell arrays 41A, 41B have blocks BK0, BK1, . . . , BKn−1 respectively arranged in the y-direction. The respective blocks BK0, BK1, . . . , BKn−1 have a plurality of cell units CU arranged in the x-direction.

Figure 20:
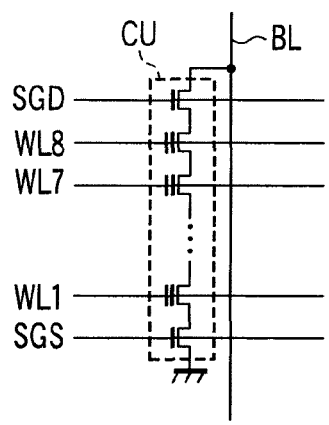
FIG. 20 is a view showing a NAND cell unit.

As shown in FIG. 20, the cell unit CU is a NAND string constituted of a plurality of memory cells MC connected in series in the y-direction, and two select gate transistors ST connected to its both ends one by one.

Bit lines BL extending in the y-direction are respectively arranged on the memory cell arrays 41A, 41B. A page buffer (PB) 43 is arranged at both ends in the y-direction of the memory cell arrays 41A, 41B. The page buffer 43 has a function of storing read data/write data temporarily at the time of read/write. In addition, the page buffer 43 functions as a sense amplifier (S/A) at the time of read, or at the time of verification of write/erase operation.

A row decoder (RDC) 44 is arranged at one end (end parts opposite to end parts of an edge side of the semiconductor chip 40) in the x-direction of the memory cell arrays 41A, 41B. In addition, a pad area 42 is arranged along an edge of the semiconductor chip 40 at one end side in the y-direction of the memory cell arrays 41A, 41B. A peripheral circuit 45 is arranged between the page buffer 43 and the pad area 42.

5. Conclusion

According to the present invention, it is possible to improve reliability of the semiconductor memory by a novel contact hole structure with respect to the word lines.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory comprising:
   first and second memory cell array areas having a memory cell;
   a word line driver arranged between the first and second memory cell array areas;
   a first word line contact area arranged between the first memory cell array area and the word line driver;
   a second word line contact area arranged between the second memory cell array area and the word line driver;
   a first word line arranged straddling the first memory cell array area and the first word line contact area;
   a second word line arranged straddling the second memory cell array area and the second word line contact area;
   a first contact hole provided on the first word line in the first word line contact area; and
   a second contact hole provided on the second word line in the second word line contact area,
   wherein a size of the first and second contact holes is larger than a width of the first and second word lines, and the lowest parts of the first and second contact holes exist at a position lower than top surfaces of the first and second word lines, and higher than bottom surfaces of the first and second word lines.

2. The semiconductor memory according to claim 1, wherein the first word line has no fringe at parts where the first contact hole is arranged, and the second word line has no fringe at parts where the second contact hole is arranged.

3. The semiconductor memory according to claim 1, wherein a center point of the first contact hole deviates from a center line of the first word line, and a center point of the second contact hole deviates from a center line of the second word line.

4. The semiconductor memory according to claim 3, wherein, in parts where the first contact hole is arranged, other word lines adjacent to the first word line in the memory cell array do not exist in a direction towards which a center point of the first contact hole deviates from a center line of the first word line, and in parts where the second contact hole is arranged, other word lines adjacent to the second word line in the memory cell array do not exist in a direction towards which a center point of the second contact hole deviates from a center line of the second word line.

5. The semiconductor memory according to claim 1, wherein a width of the first word line at parts where the first contact hole is arranged is narrower than a width of the first word line in the memory cell array area, and a width of the second word line at parts where the second contact hole is arranged is narrower than a width of the second word line in the memory cell array area.

6. The semiconductor memory according to claim 1, wherein the memory cell has a charge storage layer, a blocking insulating layer arranged on the charge storage layer, and a control gate electrode as the first and second word lines arranged on the blocking insulating layer, and in the word line contact area, the first and second word lines are arranged on an element isolation insulating layer via the blocking insulating layer.

7. The semiconductor memory according to claim 1, wherein shape of the first and second contact holes is one of a square and a circle.

* * * * *